United States Patent
Kenney, Jr. et al.

(10) Patent No.: US 7,126,403 B2
(45) Date of Patent: Oct. 24, 2006

(54) LC TANK CLOCK DRIVER WITH AUTOMATIC TUNING

(75) Inventors: John G. Kenney, Jr., West Windsor, NJ (US); Viswabharath Reddy, Edison, NJ (US); Ward Steven Titus, Princeton, NJ (US)

(73) Assignee: Analog Devices, Inc., Norwood, MA (US)

( * ) Notice: Subject to any disclaimer, the term of this patent is extended or adjusted under 35 U.S.C. 154(b) by 9 days.

(21) Appl. No.: 10/978,972

(22) Filed: Nov. 1, 2004

(65) Prior Publication Data
US 2006/0091969 A1    May 4, 2006

(51) Int. Cl.
*G06F 1/04* (2006.01)
(52) U.S. Cl. ...................... 327/291; 327/299
(58) Field of Classification Search ......... 327/291–305
See application file for complete search history.

(56) References Cited

U.S. PATENT DOCUMENTS

| | | | | |
|---|---|---|---|---|
| 5,559,463 A | * | 9/1996 | Denker et al. | 327/300 |
| 5,734,285 A | * | 3/1998 | Harvey | 327/291 |
| 6,108,000 A | * | 8/2000 | Bolotski et al. | 345/212 |
| 6,650,163 B1 | * | 11/2003 | Burns et al. | 327/295 |

OTHER PUBLICATIONS

"A 40-Gb/s Clock and Data Recovery Circuit in 0.18-μm CMOS Technology," Lee et al., *IEEE J. of Solid-State Circuits*, vol. 38, n. 12 (Dec. 2003).
"A Two-Chip 1.5-GBd Serial Link Interface," Walker et al., *IEEE J. of Solid-State Circuits*, vol. 27, n. 12 (Dec. 1992).
"A Plastic Packaged 10 Gb/s BiCMOS Clock and Data Recovering 1:4-Demultiplexer with External VCO," Hauenschild et al., *IEEE J. of Solid-State Circuits*, vol. 31, n. 12 (Dec. 1996).
"An 800mW 10Gb Ethernet Transceiver in 0.13μm CMOS," Sidiropoulos et al., *IEEE International Slid-State Circuits Conference*, session 9 (2004).

* cited by examiner

*Primary Examiner*—David Mis
(74) *Attorney, Agent, or Firm*—Gauthier & Connors LLP (57) ABSTRACT

A new clock driver is described for the use in the phase detector of a clock and data recovery circuit (CDR). By building a resonant LC tank, whose center frequency is similar to the clock frequency, a low power clock driver is realized. A method based upon minimizing power consumption is described for determining the value of the programmable capacitance. A programmable capacitance adjusts the center frequency of the tank so it matches the frequency of the clock and a finite state machine at startup determines the value of this programmable capacitance. A criterion for tuning the center frequency of the tank is to choose the capacitance which leads to the lowest power consumption. A low Q tank affords a reasonable compromise between power efficiency and performance in the CDR circuit.

33 Claims, 8 Drawing Sheets

LC TANK CLOCK DRIVER WITH AUTOMATIC TUNING

BACKGROUND OF THE INVENTION

The invention relates to the field of clock and data recovery circuit, and in particular to a LC tank clock driver with automatic tuning.

One of the core blocks in a clock and data recovery circuit is the phase detector. A particular implementation of a phase detector is a half-rate binary phase detector reported by Hauenschild et al., in the paper entitled "A plastic packaged 10 GBPS and data recovery 1:4 demultiplexer with external VCO," disclose a half-rate implementation that uses two clocks which are orthogonal to each other, wherein each clock is loaded by ten latches. A disadvantage with such an implementation is that the aggregate device and interconnect capacitance on the clocks are substantial.

Figure 1:
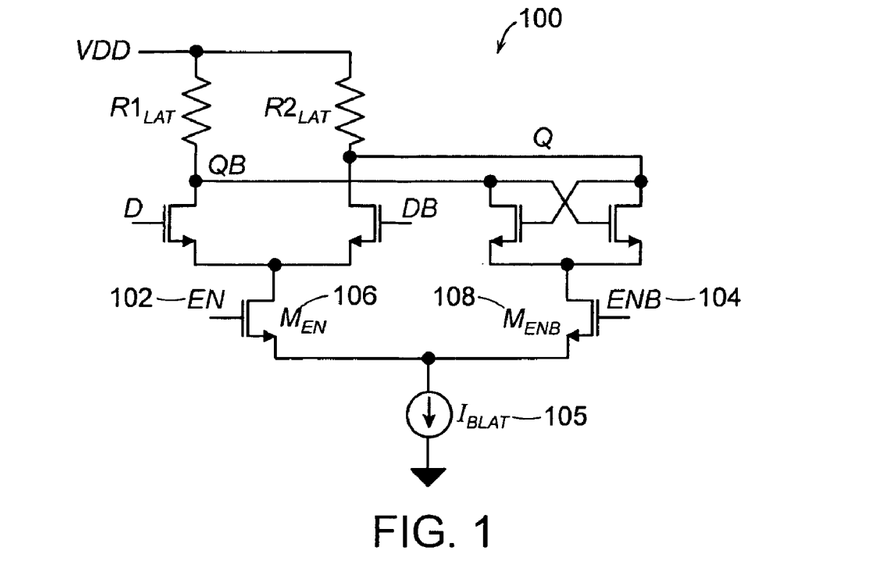
FIG. 1 illustrates an example of a CML latch.

In high-speed applications, which often have tight jitter specifications, static CMOS logic is rejected in favor of current-mode logic (CML). FIG. 1 illustrates an example of a CML latch 100. A differential clock signal drives the lower differential pair whose inputs are EN 102 and ENB 104. In CMOS technology, the single-ended swing on these clock lines should be greater than 0.4V to guarantee that the differential pair fully directs the current $I_{BLAT}$ 105 to the drain of $M_{EN}$ 106 or $M_{ENB}$ 108.

Figure 2:
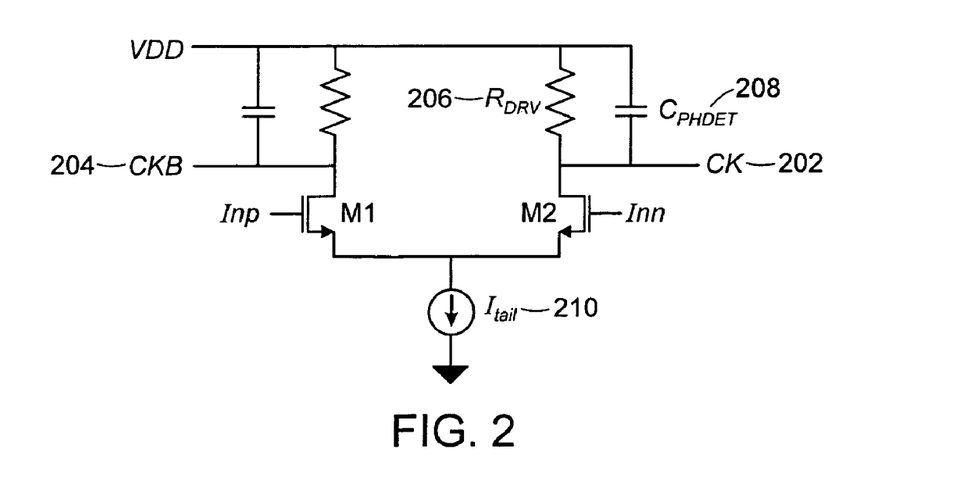
FIG. 2 illustrates a circuit for driving the differential clock lines of FIG. 1 using a differential pair with resistive loads.

FIG. 2 illustrates circuit 200 for driving the differential clock lines of FIG. 1 using a differential pair with resistive loads. The outputs of the clock driver, denoted as CK 202 and CKB 204 drive the inputs EN (102 of FIG. 1) and ENB (104 of FIG. 1) of the CML latch (100 of FIG. 1). Resistance 206 in the clock driver is in concert with capacitance 208 of the phase detector and creates a pole. The location of this pole is preferably placed as a factor of twice the clock frequency to establish large amplitude signals at the output.

A suitable application for estimating the maximum size of the resistor is OC-192 SONET where the data rate is 9.954 Gbps. The tail current ($I_{TAIL}$) 210, which should be small for low power, is inversely proportional to the value of the load resistor ($R_{DRV}$) 206. In OC-192 SONET, the half-rate clock frequency is approximately 5 GHz. A bandwidth of 10 GHz on the clock lines is twice the clock frequency. Accounting for both device and interconnect capacitance, each latch can present a single-ended load on the order of 30 fF. The total capacitance that ten latches present on each clock line is 0.3 pF. A maximum resistance of 53 Ω yields 10 GHz of bandwidth. A voltage swing of 0.4V requires a minimum bias current of 7.5 mA. The total current for two clock drivers is at least 15 mA.

Whatever the precise merits, features, and advantages of the above cited prior art, none of them achieves or fulfills the purposes of the present invention.

SUMMARY OF THE INVENTION

The present invention provides for a low-power differential clock driver which utilizes the capacitance of the latches in the phase detector and an inductor to make an LC tank. Using an inductor in parallel with this capacitance rather than, or in addition to, a resistor leads to a power efficient clock driver.

The present invention provides for a resonant LC clock driver (used in conjunction with a phase detector that is part of a clock and data recovery circuit) comprising a capacitance due to latches and interconnects, and an inductor as the resonant LC clock driver's load in parallel with the capacitance, wherein the inductor resonates out the capacitance due to latches and interconnects. A lower power consumption (than a purely resistive load) is achieved using the LC clock driver of the present invention.

In an extended embodiment, a programmable capacitance (implemented via an array such as a thermometer coded array or a binary array) is used in parallel with the above-mentioned LC clock driver, wherein a value of the programmable capacitance is chosen to provide minimum power consumption and the programmable capacitance tunes the LC clock driver by adjusting a center frequency of the LC clock driver to match the frequency of the clock associated with the driver. In another embodiment, a finite state machine is used to set the value of the programmable capacitance.

In an extended embodiment, the LC clock driver further comprises an unsilicided polysilicon resistor placed parallel with said inductor to provide a LC clock driver with a low quality factor, Q.

The present invention also provides for a resonant LC clock driver comprising a capacitance due to latches and interconnects, a resistor, and an inductor, wherein the inductor and the resistor form the resonant LC clock driver's load in parallel with the capacitance and the inductor and the resistor resonate out the capacitance due to latches and interconnects. A lower power consumption (than a purely resistive load) is achieved using the LC clock driver of the present invention.

In an extended embodiment, a programmable capacitance (implemented via an array such as a thermometer coded array or a binary array) is used in parallel with the above-mentioned LC clock driver, wherein a value of the programmable capacitance is chosen to provide minimum power consumption and the programmable capacitance tunes the LC clock driver by adjusting a center frequency of the LC clock driver to match the frequency of the clock associated with the driver. In another embodiment, a finite state machine is used to set the value of the programmable capacitance.

The present invention also provides for a method for automatically tuning a resonant LC clock driver, wherein the LC clock driver used in parallel with a programmable capacitance and the LC clock driver comprises a capacitance (due to latches and interconnects) and an inductor as the resonant LC clock driver's load in parallel with the capacitance. The inductor of this setup resonates out the capacitance due to latches and interconnects. In one embodiment, the method comprises the steps of: (a) setting an initial value of the programmable capacitance via a finite state machine; (b) tuning the resonant LC clock driver via adjusting a center frequency of the clock driver to match the frequency of the clock associated with the LC clock driver, with the adjustment performed via interacting with the state machine and changing the programmable capacitance's value. In this embodiment, tuning is based upon finding a capacitance value which leads to the lowest power consumption.

DETAILED DESCRIPTION OF THE INVENTION

Although the present invention has been shown and described with respect to several preferred embodiments thereof, various changes, omissions and additions to the form and detail thereof, may be made therein, without departing from the spirit and scope of the invention.

The present invention provides for a novel clock driver for use in the phase detector of a clock and data recovery circuit. The clock driver employs an inductor in its load to resonate out the capacitance presented by the clock lines in the phase detector. A programmable capacitance adjusts the center frequency of the tank so it matches the frequency of the clock. A finite state machine at startup determines the value of this programmable capacitance. A criterion for tuning the center frequency of the tank is to choose the capacitance which leads to the lowest power consumption.

Figure 3A:
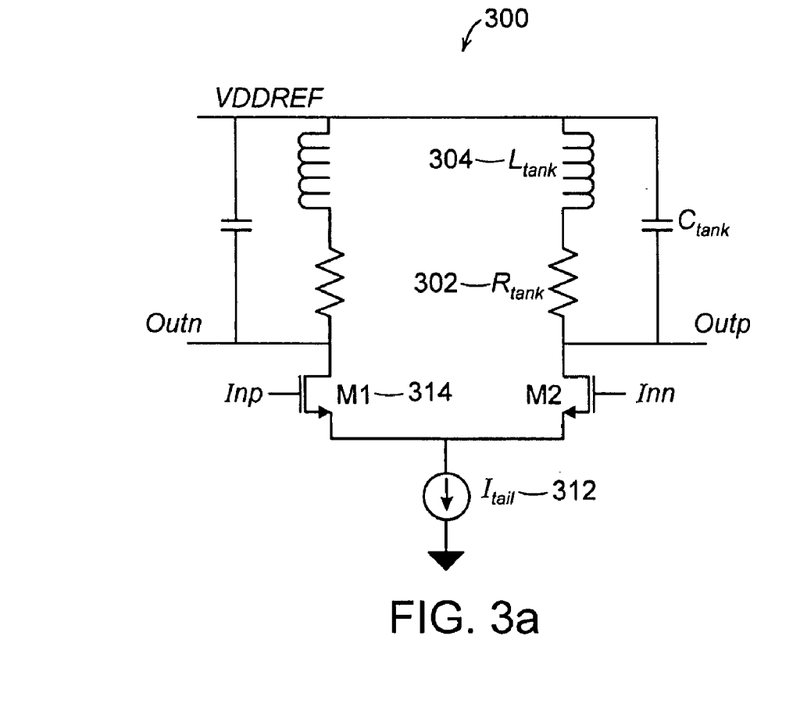
FIG. 3a illustrates a LC tank-based clock driver.
Figure 3B:
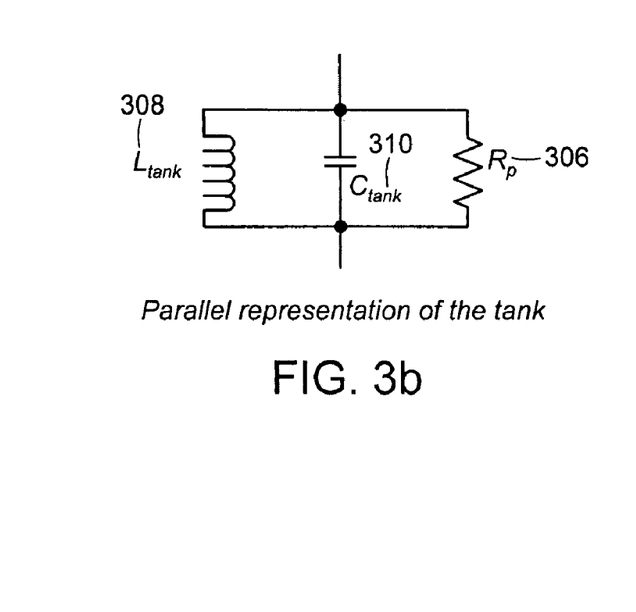
FIG. 3b illustrates a circuit for modeling the tank using a resistor $R_p$ in parallel with an inductor $L_{tank}$ and a capacitor $C_{tank}$.

FIG. 3a illustrates a LC tank-based clock driver 300. The quality factor of the tank, which is preferably in the range of 3 to 6, is set by the resistor $R_{tank}$ 302. $R_{tank}$ 302 is caused by the nonzero resistance of metal forming the inductor and is thus in series with $L_{tank}$ 304. As shown in FIG. 3b, for purposes of simplifying the computation for this comparison, the tank is modeled as a resistor $R_p$ 306 in parallel with an inductor $L_{tank}$ 308 and a capacitor $C_{tank}$ 310. At resonance, the admittance of the inductor cancels the admittance of the capacitor causing the tail current $I_{tail}$ 312 to be entirely dropped on $R_p$. The relationship between $R_p$ 306, $L_{tank}$ 308, and $C_{tank}$ 310 is given by $$R_p = Q\sqrt{\frac{L_{tank}}{C_{tank}}}.$$

A reasonable value of $L_{tank}$ 308 after accounting for both die area and power is about 1.4 nH. $C_{tank}$ 310 is about 0.724 pF for a 5 GHz clock. The equivalent parallel load, $R_p$ 306, is about 200 Ω. The value of $I_{tail}$ 312 to drive this load is 2 mA leading to a total power consumption for the two buffers of 4 mA. The power used by the LC tank is slightly less than one-third of the power used by the clock driver with resistors as loads.

Filtering Advantages of an LC tank

Other benefits accrue from using the LC tank implementation. One such advantage is that the DC offset and duty cycle distortion gets filtered between the input and the output of the tank. A perfect differential square wave has no DC offset and only odd harmonics. A rectangular waveform, with a duty cycle not 50—50 has both DC offset and even harmonic distortion An LC tank implements a bandpass filter. A bandpass filter reduces duty cycle distortion by attenuating all harmonics not within the passband of the tank. Ideally, the differential clock from the LC tank is sinusoidal in shape. An LC tank with a Q of 5 attenuates the second harmonic by about 17.5 dB and the third harmonic by about 22.5 dB. In contrast, an RC-based clock driver with its 3 dB frequency at 10 GHz attenuates the second harmonic by about 3 dB and the third harmonic by about 5.1 dB.

The LC tank also reduces the DC offset, although the finite resistance of the inductor prevents the DC offset from being totally eliminated. The DC gain for the circuit in FIG. 3a is gm1.$R_{tank}$, where gm1 is the transconductance of M1 314 and $R_{tank}$ 302 is the resistance in the metal forming the inductor. Achieving a passband gain of 20 dB requires a transconductance of 10 mA/V. $R_{tank}$ 302 can be derived from $R_p$ 306 and the Q of the tank as $$R_{tank} = \frac{R_p}{(1+Q^2)}.$$

The DC gain of the clock driver is −20 dB.

DC offset can also be eliminated by AC coupling the clock. This technique applies to both prior art and this invention. In the prior art, it may be absolutely imperative that AC coupling be used to remove DC offset. AC coupling, as it relates to this invention, has incremental benefits for the DC offset problem.

Once the DC offset of the clock is minimized, the major source of DC offset as it relates to the significant instant at which the data is sampled will come from threshold voltage mismatches in the transistors $M_{EN}$ (106 of FIG. 1) and $M_{ENB}$ (108 of FIG. 1). Threshold voltage mismatch can be reduced by making these particular devices larger. In the resistor example, a load of 30 fF per latch is assumed. Larger transistors can push this number to 45 fF, resulting in a phase detector load of 0.45 pF. This capacitance still falls significantly below the 0.724 pF needed to center the tank. The advantage of making these devices larger is that they match better and will be more fully able to switch the tail current, $I_{BLAT}$ (105 of FIG. 1). As mentioned earlier, their capacitance is part of the budget for $C_{tank}$. In contrast, the additional capacitance from $M_{EN}$ (106 of FIG. 1) and $M_{ENB}$ (108 of FIG. 1) would make $C_{PHDET}$ (206 of FIG. 2) larger and thus force $R_{DRV}$ (206 of FIG. 2) to be smaller. A smaller value for $R_{DRV}$ (206 of FIG. 2) results in higher power consumption.

Selection Criterion for Tank Quality Factor

Figure 4:
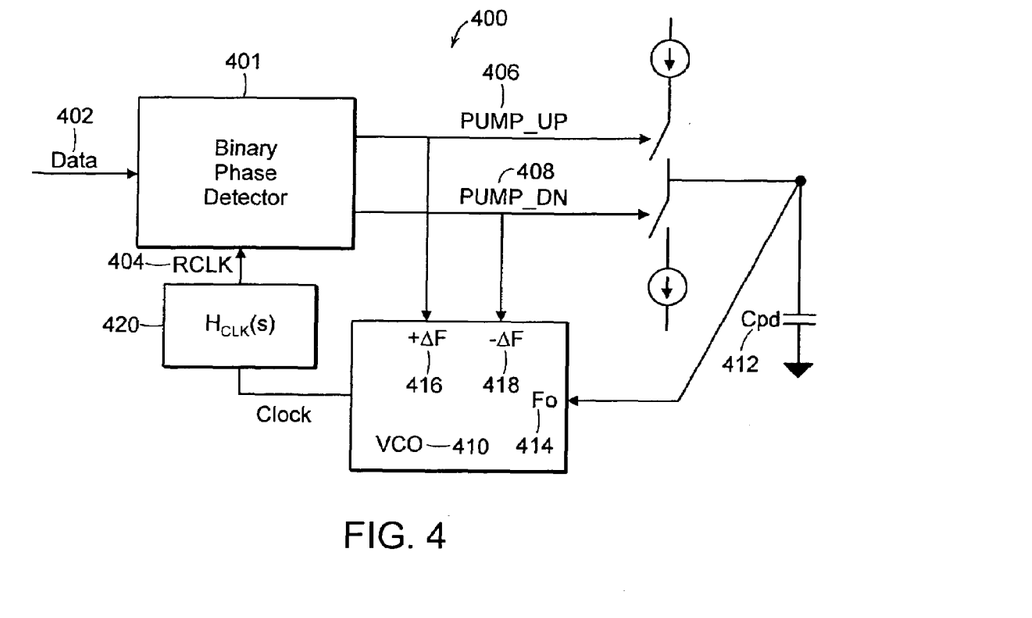
FIG. 4 illustrates a prior art "bang bang phase locked loop" architecture.

FIG. 4 illustrates the "bang bang phase locked loop" architecture 400, as proposed by Walker et al. in the paper entitled, "A Two-Chip 1.5 GBd Serial Link Interface". The phase detector 401 receives as its input non return to zero (NRZ) data 402 and a clock RCLK 404. It has two outputs denoted as PUMP_UP 406 and PUMP_DN 408 (please note that the data output from the phase detector is ignored for this discussion as it is not pertinent to the operation of the PLL). The center frequency of the voltage-controlled output (VCO) 410 is held as a voltage on capacitor Cpd 412, where Cpd 412 is the capacitor in a charge pump. Cpd 412 can be made very large so that the voltage on Cpd 412 hardly responds to signals from the phase detector, and thus activity on port Fo 414 of the VCO has minimal effect on the loop dynamics.

The "bang bang phase locked loop" shown in FIG. 4 has a high-speed path comprised of the binary phase-detector 401, the VCO 410, and the clock buffer. The output of phase detector 401 reaches directly into the VCO at ports +ΔF 416 and −ΔF 418. During the time when PUMP_UP 406 is HIGH, the output frequency from the VCO 410 is Fo+ΔF. Likewise, when PUMP_DN 408 is HIGH, the output frequency is Fo−ΔF. In the absence of data transitions, neither PUMP_UP 406 or PUMP_DN 408 are HIGH.

With a 10 Gbps data rate (not an actual 10G data rate, but provides convenient numbers) and a half-rate CDR, the center frequency from the VCO 410 is about 5 GHz. Thus, the nominal clock period is 200 ps. A possible value for ΔF in this half-rate system is 20 MHz. In a half-rate system, the binary signals PUMP_DN 408 and PUMP_UP 406 may be held high for the entire 200 ps clock period. For this discussion, the rising edges of these binary signals coincide with rising clock edges. The rising clock edge following a PUMP_DN 408 or a PUMP_UP 406 will be offset from the current edge by time.

A PUMP_DN 408 causes the period of VCO 410 to be 200.4 ps, while a PUMP_UP 406 causes the period of VCO 410 to be 199.6 ps.

An isolated PUMP_DN 408 or PUMP_UP 406 leads to a step in phase at the output of VCO 410. For discussion purposes, VCO 410 is assumed to have infinite bandwidth and no delay so that the step in phase on CLOCK occurs immediately after a step in phase on either PUMP_DN 408 or PUMP_UP 406. The question for this disclosure is how long it takes that phase step to appear on RCLK 404. The time-domain response of a clock driver with an RC load can be modeled as a time delay of TD. The resulting transfer function of the clock driver (i.e., phase out vs. phase in), which is shown as $H_{CLK}(S)$ 420 in FIG. 4, is given by $e^{-sTD}$.

Figure 5:
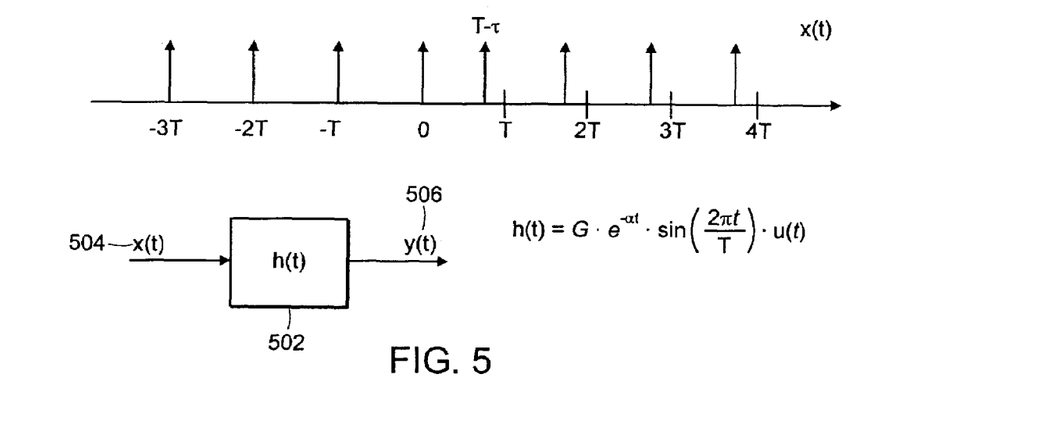
FIG. 5 illustrates a way of modeling a sinusoidal waveform by applying a sequence of impulses spaced by T to a system having an impulse response shown as h(t).

An analysis of the LC tank implementation is now provided. One way of modeling a sinusoidal waveform is to apply a sequence of impulses spaced by T to a system having an impulse response shown as h(t). FIG. 5 illustrates an example of such a model. A possible impulse response for a bandpass filter in which the center frequency and period of the forcing function are exactly aligned is $$h(t) = G \cdot e^{-\alpha t} \cdot \sin\left(\frac{2\pi t}{T}\right) \cdot u(t), \text{ where } \alpha \text{ is } \pi/QT.$$

The zero-crossings of h(t) 502 coincide with the location of the impulses in x(t) 504. Thus, the output waveform y(t) 506 has zero-crossings at −nT for n>=0. The impulse which should occur at time T is instead shifted by −τ. Subsequent impulses in x(t) are also shifted by −τ. This time-domain shift in the input x(t) accurately represents a step in phase on the input of the clock buffer. As an example, for the bang bang PLL of the present invention, τ=0.4 ps and is caused by PUMP_UP from the binary phase detector being HIGH for 1 cycle of the VCO.

Assuming there are no other incidents of a PUMP_UP or a PUMP_DN, the zero-crossing of y(t) 506 should eventually all be shifted by −τ. The step response for the output phase is given by $$\phi_{out}(nT) = -\tau\left(1 - \left(\frac{\pi}{Q}\right)^n\right)u(n-2).$$

Figure 6:
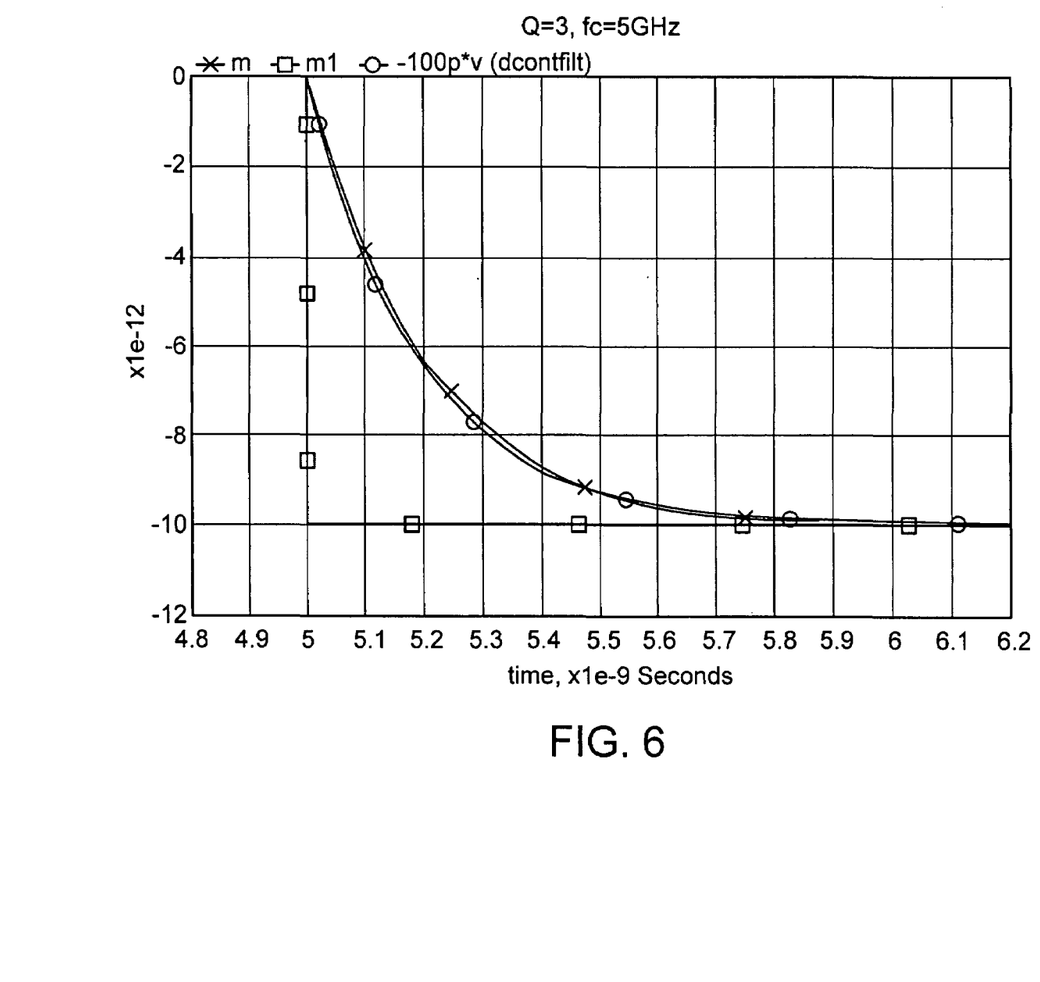
FIG. 6 illustrates a step response of a tuned buffer.

FIG. 6 illustrates a step response of a tuned buffer. In FIG. 6, there is a 10 ps step on the input phase m1; m is the measured output phase. This step response is that of a first-order low-pass filter with a corner frequency of $$\frac{1}{2QT}.$$

The transfer bandwidth of the LC tank clock driver is inversely proportional to the Q of the tank. Another disadvantage of the LC tank clock driver is that the power consumption of the clock driver increases as the Q gets smaller. Another disadvantage of having an LC tank with a large quality factor is that power consumption becomes more sensitive to mismatches between the center frequency of the tank and the period of the input waveform. An LC tank with a quality factor in the range of 3 to 6 is a reasonable compromise between transfer bandwidth and power consumption.

Mismatched Tanks

The half-rate phase detector requires that the 2 clock inputs be orthogonal to each other. It is assumed that the signals entering the clock buffers are orthogonal. The outputs of the clock buffers will likewise be orthogonal if their center frequencies are perfectly matched. Mismatches in the center frequencies of the tanks will lead to static phase offsets. The ensuing analysis will study the effect of mismatch on static phase offset.

Starting assumptions are (1) the center frequency of the in phase clock buffer is perfectly aligned to the clock $$\omega = 1/(\sqrt{L \cdot C}),$$

with mismatches in the tank being realized by changes in C on the quadrature phase clock; and (2) the clock frequency is 5 GHz.

The impedance of the tank is $$Z = \frac{sL}{s^2 LC + S\frac{L}{R_P} + 1}, \quad (1)$$

which has a phase shift of $$\phi = \frac{\pi}{2} - \text{atan}\left(\frac{\omega_{clk} \cdot L}{(R_P)(1 - \omega_{clk}^2 LC)}\right). \quad (2)$$

Figure 7:
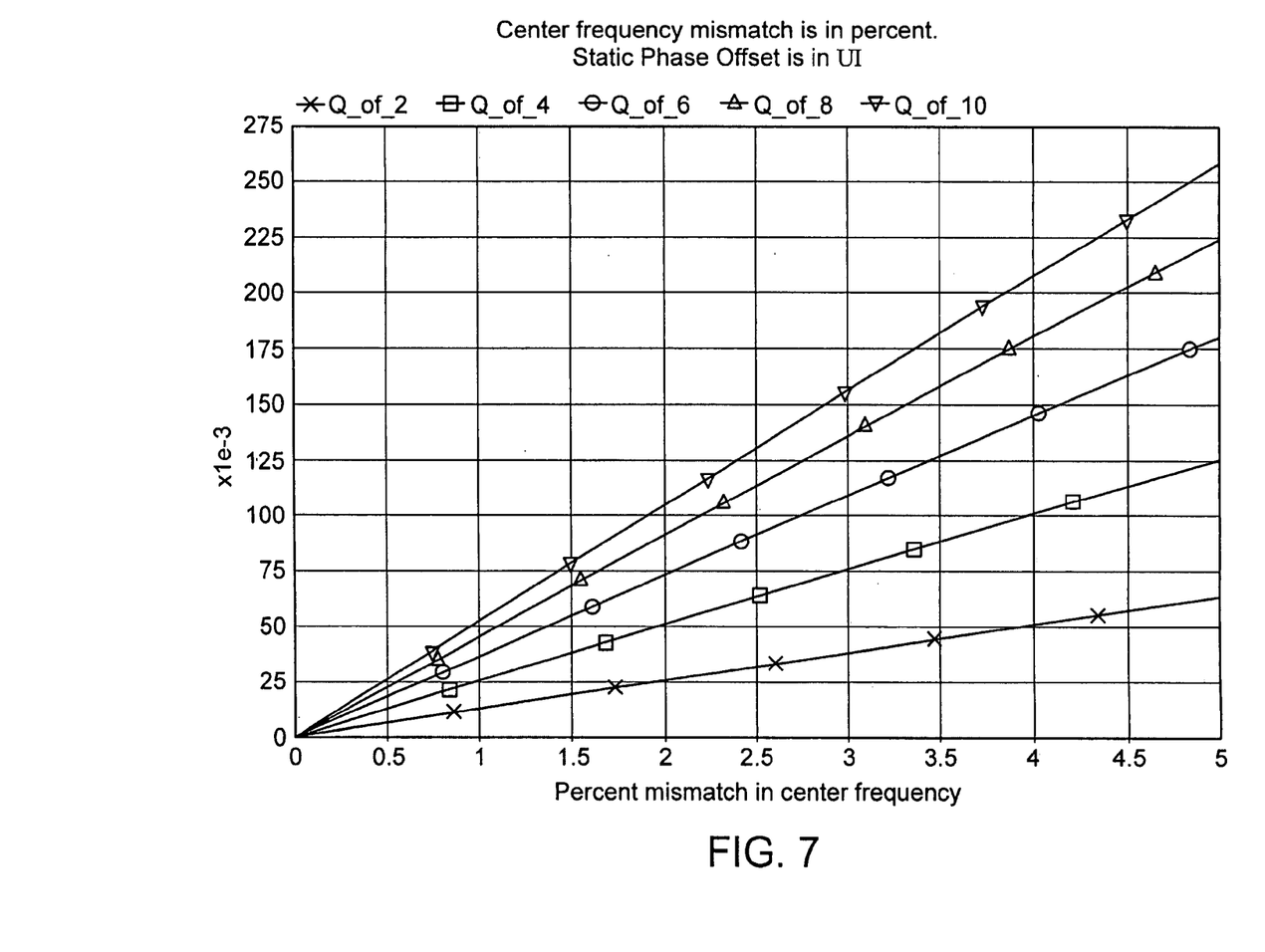
FIG. 7 illustrates the static phase offset in UI vs. center frequency mismatch in percents for Q=2, 4, 6, 8 and 10.

As this phase shift occurs for a clock of 5 GHz, it must be multiplied by 2 to get the true phase shift at 10 GBPS. Moreover, this phase shift is ideally expressed in UI. Thus, the actual phase shift in UI is $\phi_{UI} = \phi/\pi$. FIG. 7 illustrates static phase offset in UI vs. center frequency mismatch in percents for Q=2, 4, 6, 8 and 10. A 1% mismatch in tanks for Q=10 leads to a static phase offset of 0.05 UI whereas Q=4 has a static phase offset of 0.025 UI. With Q=10, it may no longer be feasible to rely on open-loop matching between the two loads to preserve orthogonality between the two clocks.

Figure 8:
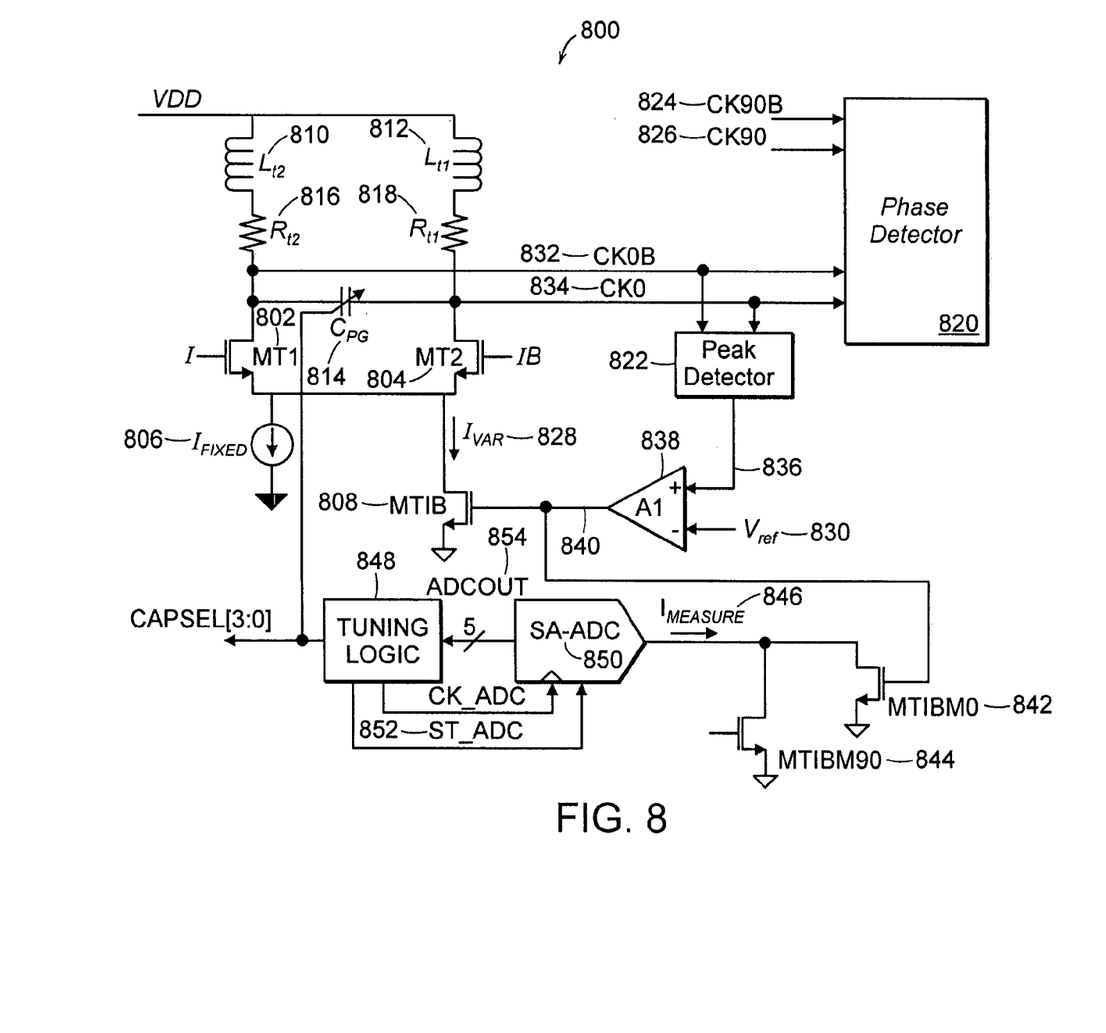
FIG. 8 shows an embodiment of the present invention's tuned buffer system.

FIG. 8 shows a tuned buffer system 800. The core buffer comprises a differential pair MT1/MT2 802 and 804; a fixed current source $I_{FIXED}$ 806; a variable current source controlled by NMOS device MTIB 808; inductive loads $L_{t1}/L_{t2}$ 810 and 812; a programmable capacitance $C_{PG}$ 814; and resistors $R_{T1}/R_{T2}$ 816 and 818 for reducing the quality factor of the tank. Phase detector 820 and peak detector 822 also provide impedances which must be considered when specifying the programmable range of $C_{PG}$ 814. There is a second clock buffer not shown for driving CK90 826 and CK90B 824. This second clock buffer contains all of the circuitry listed for the core clock buffer.

An automatic gain control (AGC) loop adjusts $I_{VAR}$ 828 so that the output swing is equal to $V_{ref}$ 830. Peak detector 822 determines the swing on CK0 834 and CK0B 832. Output 836 of peak detector 822 is compared to $V_{ref}$ 830 at the input of amplifier A1 838. Output 840 of amplifier A1 838 is applied to the gate of MTIB 808 which adjusts $I_{VAR}$ 828. When the center frequency of the tank differs significantly from the frequency of the clock signal, $I_{VAR}$ 828 must be large enough to get a swing of $V_{ref}$ 830 on CK0 834 and CK0B 832.

An automatic tuning loop sets the programmable capacitance $C_{PG}$ 814 via bits CAPSEL <3:0> by attempting to minimize the current $I_{VAR}$ 828. The drain current in MTIBM0 842 is a scaled version of the drain current in MTIB 808, $I_{VAR}$ 828. The drain current in MTIBM90 844 is a scaled version of the current $I_{VAR}$ 828 in the driver for CK90/CK90B 826 and 824. The drain currents of MTIBM0 842 and MTIBM90 844 are summed to produce $I_{MEASURE}$ 846. As the control word CAPSEL <3:0> is shared by both buffers, the average current as characterized by $I_{MEASURE}$ 846 is the parameter which is minimized.

Upon START_TUNE being set high, TUNING LOGIC 848 sets CAPSEL=0; this starting point is used in this realization of the search algorithm which involves incrementing through all of the codes for CAPSEL. The AGC loops adjust $I_{VAR}$ 828 so that the swing on CK0/CKOB 834 and 832 is $V_{REF}$ 830. There is a timeout between when the times when CAPSEL is changed and when $I_{MEASURE}$ 846 is digitized. This timeout is larger than the settling time of the AGC loop.

A successive approximation ADC 850 digitizes $I_{MEASURE}$ 846, although other ADC architectures can be used. The SA-ADC 850 has a current steering D/A converter, a comparator and control logic. Data conversion begins when ST_ADC 852 is set HIGH by the tuning logic. As this is a successive approximation ADC, five cycles of ST_CLK are needed to generate ADCOUT 854. The current out of the current steering D/A converter is approximately equal to $I_{MEASURE}$ 846 once the digitization in completed.

Figures 9, 11:
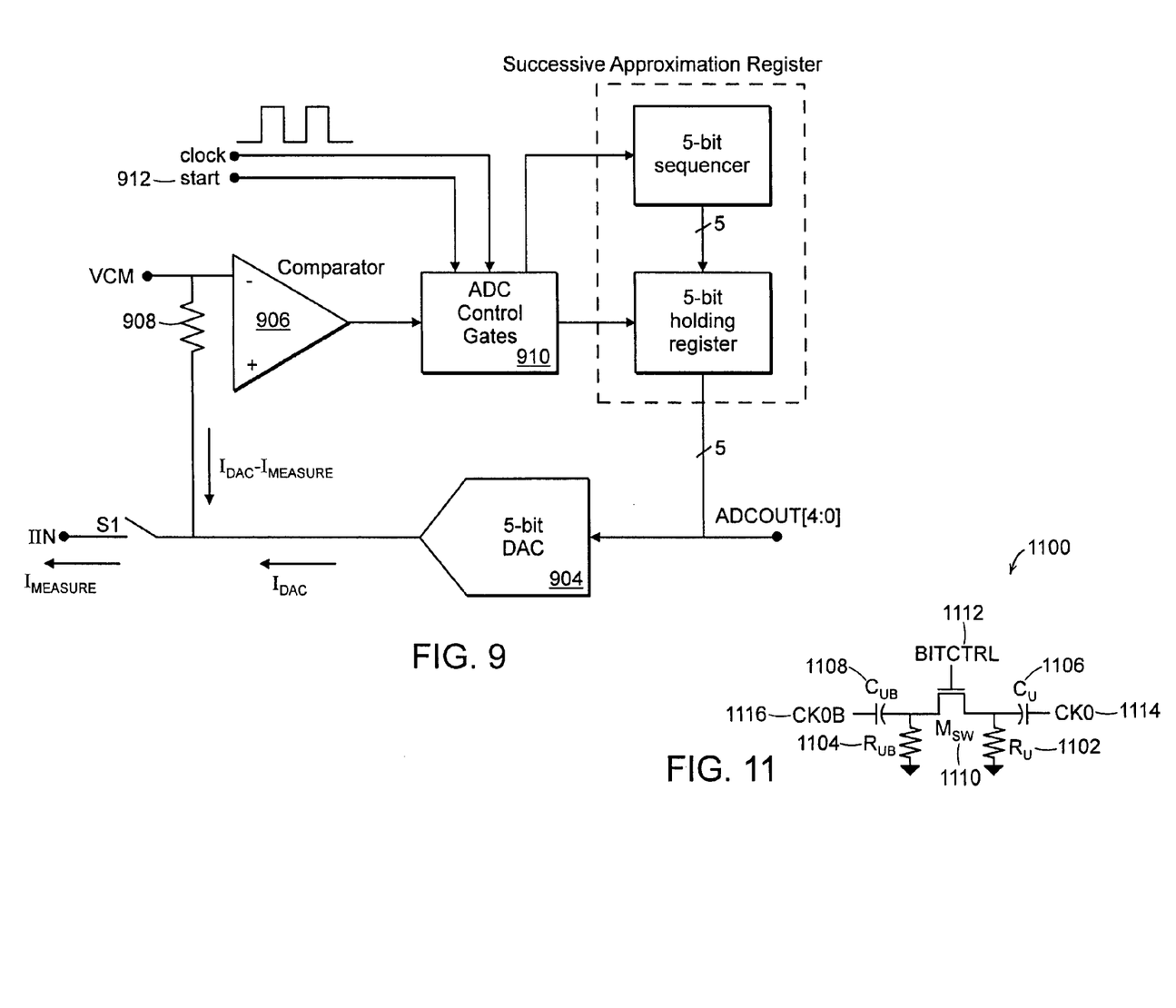
FIG. 9 shows a possible implementation of a successive approximation A/D converter.
FIG. 11 illustrates an implementation of a switched capacitor which is part of $C_{PG}$ of FIG. 8.

FIG. 9 shows a possible implementation of a successive approximation A/D converter. The current $I_{MEASURE}$ is applied to the SA-ADC that implements a switch which is only closed when the A/D converter is being used. The output of the switch is coupled to a current-steering D/A converter 904, a voltage comparator 906, and a resistor 908. A finite state machine shown as ADC Control Gates 910 begins a data conversion when a strobe on start 912 goes HIGH.

The dynamic range of the current-steering D/A converter 904, internal to SA-ADC, has been set so that when CAPSEL is far from it optimal value that ADCOUT saturates to its maximum codeword. In the region where the tuned-buffer is close to its optimal value, and thus $I_{VAR}$ is relatively small, the ADC has at least five LSB codewords in the worst simulation corner before it saturates. The advantage of specifying the dynamic range of the D/A in this way, is it reduces the number of bits needed in the ADC by approximately two. Also, it is very unlikely that $I_{MEASURE}$ and the current from the D/A converter are equal when ADCOUT is at its maximum value.

Figure 10:
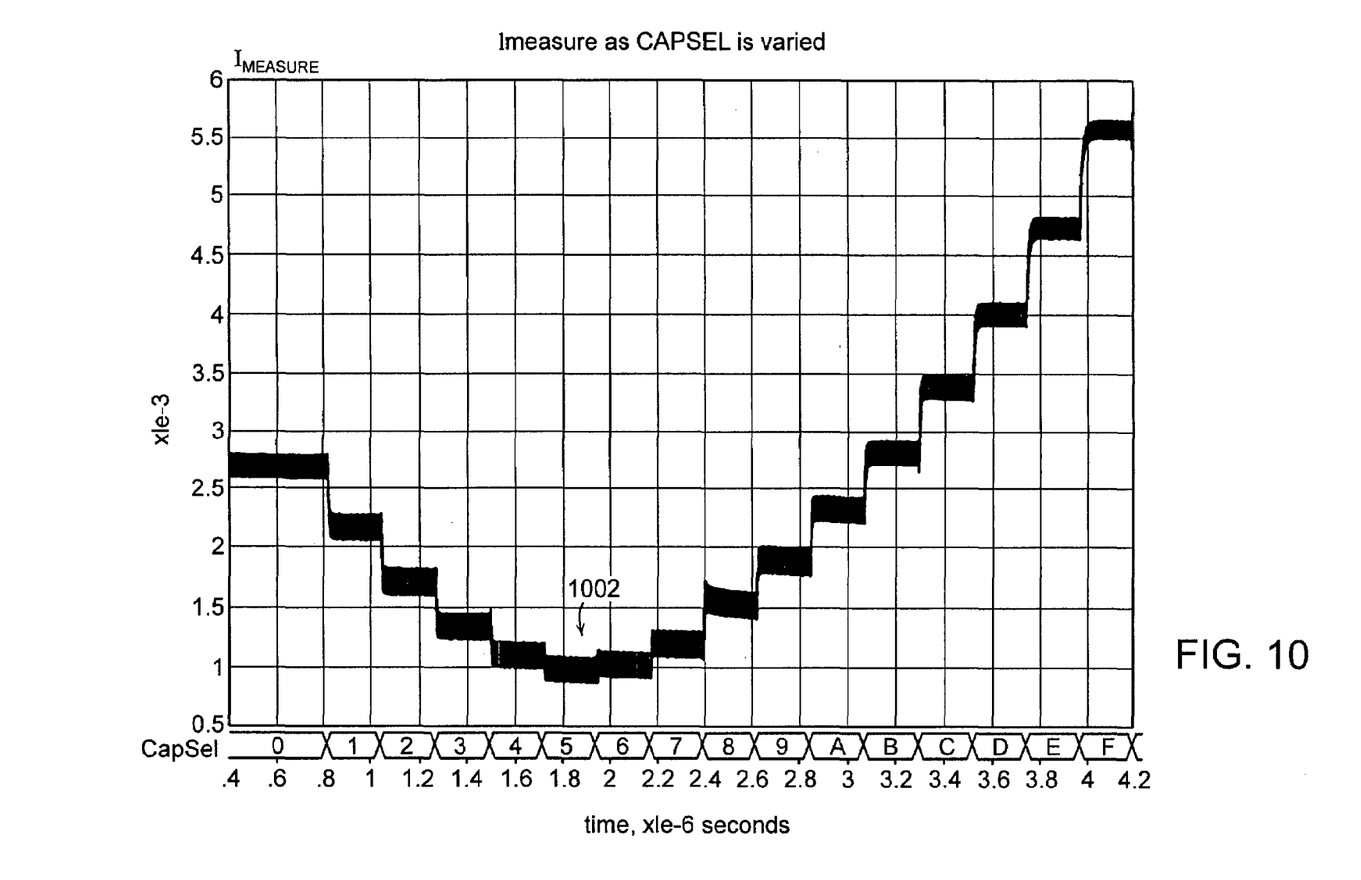
FIG. 10 illustrates a plot of CAPSEL vs. $I_{MEASURE}$ for a realization of the tuned buffer.

The value of ADCOUT and its associated codeword CAPSEL are stored in memory internal to TUNING LOGIC. The remaining 15 codewords for CAPSEL are tested with the minimum value for ADCOUT and CAPSEL being stored. FIG. 10 illustrates a plot of CAPSEL vs. $I_{MEASURE}$ for a realization of the tuned buffer. CAPSEL is equal to five leads to the lowest power consumption, as indicated by arrow 1002.

Programmable Capacitor Array

FIG. 11 illustrates implementation 1100 of a switched capacitor which is part of $C_{PG}$ (814 of FIG. 8). In one embodiment, a thermometer coded array using 15 of these cells is used to guarantee that size of $C_{PG}$ changes monotonically in relationship to CAPSEL. However, it should be noted that this invention is not restricted to thermometer coded arrays. For example, the use of arrays such as (but not limited to) a binary array is within the scope of the present invention.

Resistors $R_U$ 1102 and $R_{UB}$ 1104 are large-valued resistors which set a DC bias voltage on the bottom plates of $C_U$ 1106 and $C_{UB}$ 1108. The zero formed by $R_U$ 1102 and $C_U$ 1104 should be at least a decade below the clock rate to prevent this network from looking capacitive at the center frequency of the tank.

$M_{SW}$ 1110 is shown as an NMOS transistor. When BITC-TRL 1112 is HIGH, the bottom plates of $C_U$ 1106 and $C_{UB}$ 1108 are shorted to form a virtual ground. It should be noted that placing the switch on the bottom plates as shown leads to minimum resistance in the switch. Moreover, the switch does not see large signal swings so its impedance is fairly constant over the full swing range of CK0 1114 and CKOB 1116. The zero formed by one-half of the drain-to-source resistance of $M_{SW}$ 1110 and $C_U$ 1106 should be a decade above the clock frequency to guarantee that this network look capacitive.

Q Control

There are a few ways to construct a tank with low Q. In one embodiment, an inductor is made with high resistivity, wherein such an embodiment has the advantage of providing a compact area. The problem with this approach, however, is that copper and aluminum which are the metals typically used for inductors in CMOS processes have a temperature coefficient on the order of 3200 ppm/° C. and a 45% variation when manufactured in large scale. An inductor designed for a quality factor of 5 at 50° C. and nominal process will have a quality factor of 10.68 at 0° C. and fast process corner and a quality factor of 3 at 100° C. and slow process corner. Thus, there is a 4.84:1 difference in power consumption between these 2 temperature and process extremes. The ability of the tank to reject DC offsets also becomes sensitive to temperature as this temperature coefficient directly impacts the value of $R_{TANK}$.

In another embodiment, an inductor is made with a high quality factor (e.g., 10). In a system where the VCO is implemented as an LC tank, the inductor from the tank may be conveniently reused in the clock driver. An unsilicided polysilicon resistor may be placed in parallel with the inductor. The temperature coefficient of the polysilicon resistor is on the order of 110 ppm/° C. A tank designed for a quality factor of 5 at 50° C. and nominal process will have a quality factor of 8.37 at 0° C. and fast process corner and a quality factor of 3.62 at 100° C. and slow process corner. Thus, there is a 2.8:1 difference in power consumption between these 2 temperature extremes. Another advantage of such an approach is that $R_{TANK}$ for this implementation is 50% of $R_{TANK}$ in the prior implementation leading to a 6 dB improvement in the attenuation of DC offsets.

What is claimed is:

1. A resonant LC clock driver comprising:
   a capacitance due to latches and interconnects; and
   an inductor as said resonant LC clock driver's load in parallel with said capacitance, said inductor resonating out said capacitance due to latches and interconnects, wherein said resonant LC clock driver provides a lower power consumption than a purely resistive load.

2. A resonant LC clock driver, as per claim 1, wherein said LC clock driver is used in conjunction with a phase detector.

3. A resonant LC clock driver, as per claim 2, wherein said circuit phase detector is part of a clock and data recovery circuit (CDR).

4. A resonant LC clock driver, as per claim 1, wherein said LC clock driver is tuned via a programmable capacitance used in parallel with said LC clock driver.

5. A resonant LC clock driver, as per claim 4, wherein a value of said programmable capacitance is optimized for minimum power consumption.

6. A resonant LC clock driver, as per claim 4, wherein said programmable capacitance tunes said LC clock driver by adjusting a center frequency of the LC clock driver to match the frequency of the clock.

7. A resonant LC clock driver, as per claim 4, wherein the value of said programmable capacitance is set via a finite state machine.

8. A resonant LC clock driver, as per claim 4, wherein said programmable capacitance is implemented via any of the following: a thermometer coded array or a binary array.

9. A resonant LC clock driver, as per claim 1, wherein said LC clock driver further comprises an unsilicided polysilicon resistor placed parallel with said inductor to provide a LC clock driver with a low quality factor, Q.

10. A resonant LC clock driver comprising:
    a capacitance due to latches and interconnects;
    a resistor; and
    an inductor and said resistor as said resonant LC clock driver's load in parallel with said capacitance, said inductor and said resistor resonating out said capacitance due to latches and interconnects,
    wherein said resonant LC clock driver provides a lower power consumption than a purely resistive load.

11. A resonant LC clock driver, as per claim 10, wherein said LC clock driver is used in conjunction with a phase detector.

12. A resonant LC clock buffer circuit, as per claim 11, wherein said phase detector is part of a clock and data recovery circuit (CDR).

13. A resonant LC clock driver, as per claim 10, wherein said LC clock driver is tuned via a programmable capacitance used in parallel with said LC clock driver.

14. A resonant LC clock driver, as per claim 13, wherein a value of said programmable capacitance is optimized for minimum power consumption.

15. A resonant LC clock driver, as per claim 13, wherein said programmable capacitance tunes said LC clock driver by adjusting a center frequency of the LC clock driver to match the frequency of the clock.

16. A resonant LC clock driver, as per claim 13, wherein the value of said programmable capacitance is set via a finite state machine.

17. A resonant LC clock driver, as per claim 13, wherein said programmable capacitance is implemented via any of the following: a thermometer coded array or a binary array.

18. A resonant LC clock driver, as per claim 10, wherein said LC clock driver further comprises an unsilicided polysilicon resistor placed parallel with said inductor to provide a LC clock driver with a low quality factor, Q.

19. A method for automatically tuning a resonant LC clock driver, said LC clock driver used in parallel with a programmable capacitance, said LC clock driver comprising a capacitance due to latches and interconnects and an inductor as said resonant LC clock driver's load in parallel with said capacitance, said inductor resonating out said capacitance due to latches and interconnects, said method comprising the steps of:
    a. setting an initial value of said programmable capacitance via a finite state machine;
    b. tuning said resonant LC clock driver via adjusting a center frequency of said clock driver to match the frequency of the clock associated with said LC clock driver, said adjusting performed via interacting with said state machine and changing said programmable capacitance's value, and
    wherein said tuning is based upon finding the capacitance which leads to the lowest power consumption.

20. A method for automatically tuning a resonant LC clock driver, as per claim 19, wherein said LC clock driver is used in conjunction with a phase detector.

21. A method for automatically tuning a resonant LC clock driver, as per claim 20, wherein said phase detector is part of a clock and data recovery circuit (CDR).

22. A method for automatically tuning a resonant LC clock driver, as per claim 19, wherein said programmable capacitance is implemented via any of the following: a thermometer coded array or a binary array.

23. A method for automatically tuning a resonant LC clock driver, as per claim 19, wherein said LC clock driver further comprises an unsilicided polysilicon resistor placed parallel with said inductor to provide a LC clock driver with a low quality factor, Q.

24. A method for automatically tuning a resonant LC clock driver, said LC clock driver used in parallel with a programmable capacitance, said LC clock driver comprising a capacitance due to latches and interconnects, a resistor, and an inductor and said resistor as said resonant LC clock driver's load in parallel with said capacitance, said inductor and said resistor resonating out said capacitance due to latches and interconnects, said method comprising the steps of:
    a. setting an initial value of said programmable capacitance via a finite state machine;
    b. tuning said resonant LC clock driver via adjusting a center frequency of said clock driver to match the frequency of the clock associated with said LC clock driver, said adjusting performed via interacting with said state machine and changing said programmable capacitance's value, and
    wherein said tuning is based upon finding the capacitance which leads to the lowest power consumption.

25. A method for automatically tuning a resonant LC clock driver, as per claim 24, wherein said LC clock driver is used in conjunction with a phase detector.

26. A method for automatically tuning a resonant LC clock driver, as per claim 24, wherein said phase detector is part of a clock and data recovery circuit (CDR).

27. A method for automatically tuning a resonant LC clock driver, as per claim 24, wherein said programmable capacitance is implemented via any of the following: a thermometer coded array or a binary array.

28. A method for automatically tuning a resonant LC clock driver, as per claim 24, wherein said LC clock driver further comprises an unsilicided polysilicon resistor placed parallel with said inductor to provide a LC clock driver with a low quality factor, Q.

29. An integrated circuit comprising:
   a resonant LC clock driver comprising a capacitance associated with latches and interconnects, and an inductor as its load to resonate out the capacitance presented by clock lines;
   a programmable capacitance adjusting a center frequency of said resonant LC clock driver so it matches the frequency of the clock associated with said resonant LC clock driver;
   a finite state machine, at startup, determining a value of said programmable capacitance, and
   wherein said integrated circuit tunes said LC clock driver based upon interacting with said programmable capacitance and said finite state machine to identify an optimized capacitance value that leads to minimum power consumption.

30. An integrated circuit as per claim 29, wherein said LC clock driver is used in conjunction with a phase detector.

31. An integrated circuit as per claim 29, wherein said phase detector is part of a clock and data recovery circuit (CDR).

32. An integrated circuit as per claim 29, wherein said programmable capacitance is implemented via any of the following: a thermometer coded array or a binary array.

33. An integrated circuit as per claim 29, wherein said LC clock driver further comprises an unsilicided polysilicon resistor placed parallel with said inductor to provide a LC clock driver with a low quality factor, Q.

* * * * *